(12) United States Patent
Nishizawa et al.

(10) Patent No.: US 8,786,248 B2
(45) Date of Patent: Jul. 22, 2014

(54) FLYING CAPACITOR TYPE VOLTAGE DETECTING CIRCUIT AND BATTERY PROTECTION INTEGRATED CIRCUIT

(75) Inventors: Akihiro Nishizawa, Tokyo (JP); Takashi Takeda, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 373 days.

(21) Appl. No.: 13/329,881

(22) Filed: Dec. 19, 2011

(65) Prior Publication Data
US 2012/0161693 A1   Jun. 28, 2012

(30) Foreign Application Priority Data

Dec. 22, 2010   (JP) ................................. 2010-286756

(51) Int. Cl.
*H02J 7/00*   (2006.01)

(52) U.S. Cl.
USPC .............................. 320/103; 320/107; 307/64

(58) Field of Classification Search
USPC ......... 320/103, 107, 166, 167; 307/46, 64, 66
See application file for complete search history.

(56) References Cited

U.S. PATENT DOCUMENTS

| | | | | |
|---|---|---|---|---|
| 5,254,929 | A | * | 10/1993 | Yang .............................. 320/103 |
| 5,982,645 | A | * | 11/1999 | Levran et al. .................... 363/37 |
| 6,717,291 | B2 | * | 4/2004 | Purkey .......................... 307/10.6 |
| 6,940,292 | B2 | * | 9/2005 | Lalla ............................. 324/661 |
| 2005/0073866 | A1 | * | 4/2005 | Cummings ..................... 363/63 |
| 2005/0169021 | A1 | * | 8/2005 | Itoh ................................ 363/60 |
| 2007/0189495 | A1 | * | 8/2007 | Crawley et al. ............... 379/323 |
| 2008/0252257 | A1 | | 10/2008 | Sufrin-Disler et al. | |
| 2009/0295398 | A1 | | 12/2009 | Ohnuki | |

FOREIGN PATENT DOCUMENTS

| | | |
|---|---|---|
| JP | 61-054708 | 3/1986 |
| JP | 61-054709 | 3/1986 |
| JP | 2007-010316 | 1/2007 |
| JP | 2008-538408 | 10/2008 |
| JP | 2009-150867 | 7/2009 |

OTHER PUBLICATIONS

Japanese Office Action mailed Apr. 30, 2014 with partial English translation.

* cited by examiner

*Primary Examiner* — Yalkew Fantu
(74) *Attorney, Agent, or Firm* — IPUSA, PLLC

(57) ABSTRACT

A voltage-detecting circuit includes a flying capacitor; a first switch circuit allowing plural electric cells connected in series, so that polarity of voltage across electrodes of the flying capacitor charged by one of the electric cells is opposite to polarity of voltage across the electrodes of the flying capacitor charged by an adjacent one of the electric cells; a second switch circuit discharging the flying capacitor; an output circuit outputting a signal depending on the voltage across the flying capacitor; a shield arranged around the flying capacitor electrodes to substantially equalize parasitic capacitances between the shield and each of the electrodes; and a voltage-controlling circuit equalizing voltage between one of the electrodes of the flying capacitor and the shield when charging the flying capacitor, with voltage between another one of the electrodes of the flying capacitor and the shield when discharging the flying capacitor.

13 Claims, 8 Drawing Sheets

FLYING CAPACITOR TYPE VOLTAGE DETECTING CIRCUIT AND BATTERY PROTECTION INTEGRATED CIRCUIT

CROSS-REFERENCE TO RELATED APPLICATION

The present application is based upon and claims the benefit of priority of Japanese Patent Application No. 2010-286756, filed on Dec. 22, 2010, the entire contents of which are incorporated herein by reference.

BACKGROUND OF THE INVENTION

1. Field of the Invention

The present invention relates to a flying capacitor type voltage detecting circuit and a battery protection integrated circuit, particularly to a technology that is capable of reducing parasitic capacitance.

2. Description of the Related Art

FIG. 1 is a related art circuit diagram of a flying capacitor type voltage detecting circuit. This voltage detecting circuit is configured to detect a voltage (a cell voltage) of each of electric cells that constitute an assembled battery.

In order to detect a voltage of, for example, a battery B0, a flying capacitor CI is first electrically charged by turning on input sampling switches SW6, SW7. Next, when the input sampling switches SW6, SW7 are turned off and output sampling switches SW14, SW19 are turned on, electric charge of the flying capacitor CI is transferred to an integral capacitor CF. With this, a converted voltage VOUT(0), which corresponds to the voltage of the battery B0, appears at an output terminal of an operational amplifier A1 as a detected voltage of the battery B0.

In order to detect a voltage of, for example, a battery B1, the flying capacitor CI is first electrically charged by turning on input sampling switches SW7, SW8. In this case, the flying capacitor is charged with a voltage whose polarity is opposite to that of the voltage charged when the voltage of the battery B0 is detected. Next, when the input sampling switches SW7, SW8 are turned off and output sampling switches SW18, SW15 are turned on, electric charge of the flying capacitor CI is transferred to the integral capacitor CF. With this, a converted voltage VOUT(1), which corresponds to the voltage of the battery B1, appears at the output terminal of the operational amplifier A1 as a detected voltage of the battery B1.

Incidentally, a voltage detecting circuit that is capable of detecting a voltage of each of electric cells that constitute an assembled battery is disclosed, for example, in Japanese Patent Application Laid-Open Publication No. 2009-150867 and Published Japanese translations of PCT International Publication for Patent Applications No. 2008-538408.

When a flying capacitor type voltage detecting circuit is integrated into an integrated circuit (IC), a parasitic capacitance within the IC is too large to be neglected compared to an electric capacitance of the flying capacitor, which adversely affects accuracy of a detected voltage.

With reference to FIG. 1, influence of the parasitic capacitance inside the IC on accuracy of the converted voltage VOUT(1) is estimated. Assuming that an electric potential at a node TN is VN, and capacitances of the flying capacitor CI and the integral capacitor CF are equal to C, a parasitic capacitance CD3+CN3 at a node N3 and a parasitic capacitance CD4+CN4 are equal to CD+CN, the following equations are obtained.

$$VN+1-VN=VBAT \quad (1)$$

$$CI=CF=C, \text{ and} \quad (2)$$

$$CD3+CN3=CD4+CN4=CD+CN \quad (3)$$

where VBAT is a voltage of the electric cell BN, and N is an integer (>0).

In the voltage detection circuit shown in FIG. 1, one of the parasitic capacitance CD3+CN3 and the parasitic capacitance CD4+CN4 is discharged to a reference terminal VGND by the switch SW14 or SW18 when the electric charge of the flying capacitor CI is transferred to the integral capacitor CF. Therefore, the remaining one of the parasitic capacitance CD3+CN3 and the parasitic capacitance CD4+CN4 affects the integral capacitor CF.

On the other hand, the converted voltage VOUT(N) corresponding to a voltage of the electric cell BN is expressed in the following.

$$VOUT(N)=[CI\times(VN+1-VN)+(CD+CN)\times VN]/CF \quad (4)$$

With this expression, the converted voltage VOUT(4), which may include the largest error, is expressed as follows.

$$VOUT(4)=[CI\times(V5-V4)+(CD4+CN4)\times V4]/CF \quad (5)$$

Because V5−V4=VBAT, V4=4×VBAT, and CD4+CN4=CD+CN, the VOUT(4) is obtained as follows.

$$\begin{aligned}VOUT(4) &= [CI \times VBAT + (CD + CN) \times 4 \times VBAT]/CF \\ &= VBAT \times CI/CF + 4 \times VBAT \times (CD+CN)/CF\end{aligned} \quad (6)$$

In addition, because CI/CF=1, the converted voltage VOUT(4) becomes $$VOUT(4)=VBAT+4\times VBAT\times(CD+CN)/CF \quad (7)$$

Moreover, because the error associated with the voltage conversion is expressed as VOUT(4)−VBAT, the error is expressed as follows.

$$VOUT(4)-VBAT=4\times VBAT\times(CD+CN)/CF \quad (8)$$

In order to reduce the error expressed by the equation (8) to 50 mV or less, the following relationship needs to be satisfied.

$$4\times VBAT\times(CD+CN)/CF \leq 50\times 10^{-3} \quad (9)$$

Assuming that VBAT is 4.2 V and CF is $10\times10^{-12}$ F, $$(CD+CN)\leq 29.8\times 10^{-15} \quad (10)$$

However, when the flying capacitor CI composed of an upper electrode and a lower electrode is formed in the IC substrate, and it is assumed that a distance between the lower electrode and the IC substrate is 20 times greater than a distance between the upper electrode and the lower electrode, the parasitic capacitance between the lower electrode and the IC substrate becomes about 0.5 pF (500 fF), which corresponds to one twentieth of the capacitance of the flying capacitor CI. Namely, the parasitic capacitance (500 fF) between the lower electrode and the IC substrate is far greater than the above permissible capacitance of 30 fF.

From the foregoing, it is difficult to integrate the flying capacitor into the IC substrate, because the flying capacitor type voltage detecting circuit has a relatively large parasitic capacitance.

The present invention has been made in view of the above, and provides a flying capacitor type voltage detecting circuit and a battery protection integrated circuit that are capable of reducing an influence of parasitic capacitance thereby enabling integration of a flying capacitor in an IC.

SUMMARY OF THE INVENTION

According to a first aspect of the present invention, there is provided a flying capacitor type voltage detecting circuit including a flying capacitor; a first switch circuit that allows each of plural electric cells that are connected in series thereby to constitute an assembled battery to charge the flying capacitor, so that polarity of voltage across electrodes of the flying capacitor when charged by a first one of the plural electric cells is opposite to polarity of voltage across the electrodes of the flying capacitor when charged by a second one of the plural electric cells, wherein the second one of the plural electric cells is adjacent to the first one of the plural electric cells; a second switch circuit that discharges the flying capacitor; an output circuit that outputs a signal depending on the voltage across the flying capacitor; a first shielding section that is arranged around the electrodes of the flying capacitor thereby to substantially equalize parasitic capacitances between the first shielding section and each of the electrodes; and a voltage controlling circuit that substantially equalizes voltage between one of the electrodes of the flying capacitor and the first shielding section when the flying capacitor is charged with voltage between the other one of the electrodes of the flying capacitor and the first shielding section when the flying capacitor is discharged.

According to a second aspect of the present invention, there is provided a battery protection integrated circuit comprising the flying capacitor type voltage detecting circuit according to the first aspect, thereby protecting the assembled battery in accordance with a detection result of the flying capacitor type voltage detecting circuit.

DETAILED DESCRIPTION OF THE PREFERRED EMBODIMENTS

According to an embodiment of the present invention, there are provided a flying capacitor type voltage detecting circuit and a battery protection integrated circuit that are capable of reducing an influence of parasitic capacitance thereby to enable integration of a flying capacitor in an IC.

Figure 1:
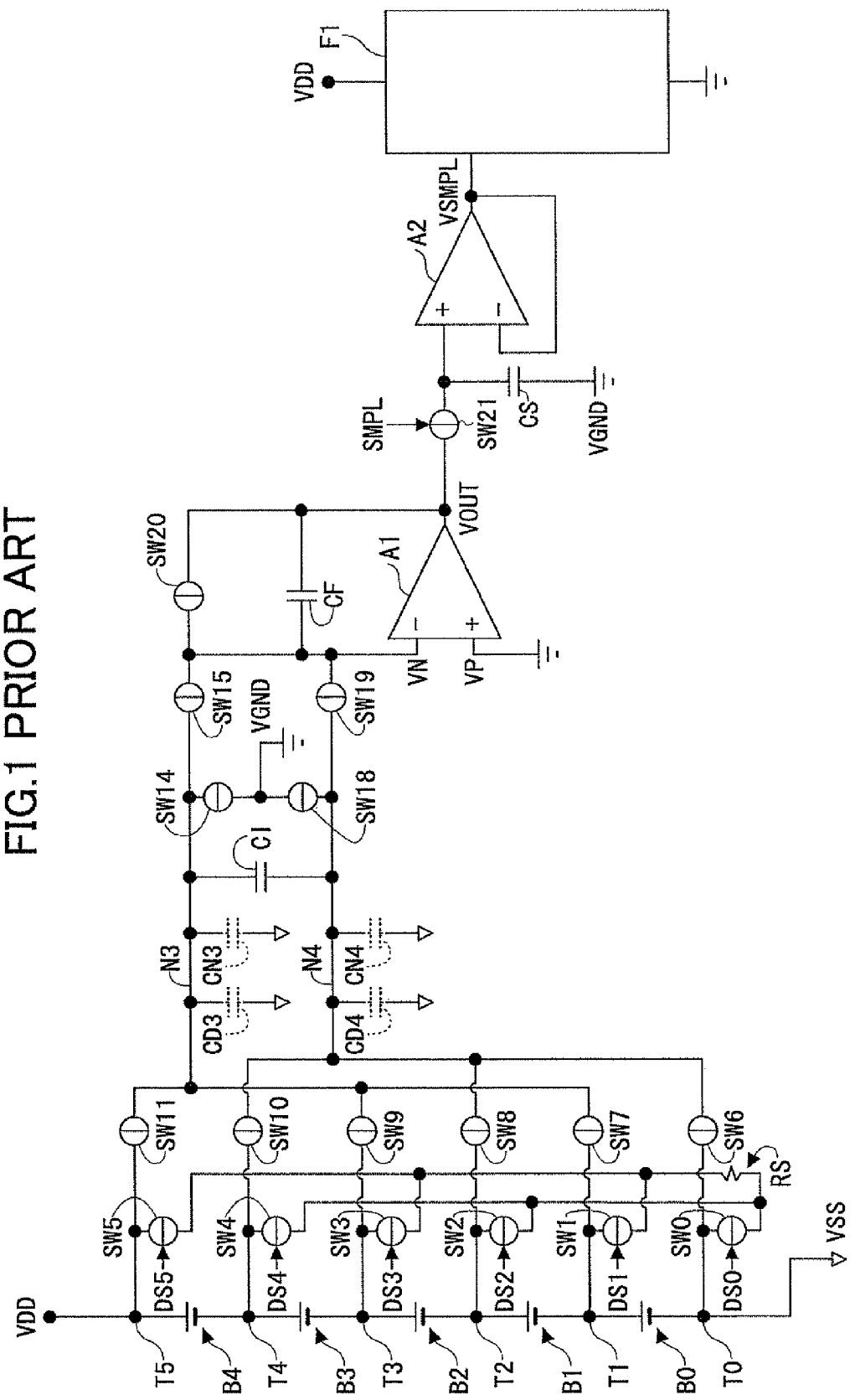
FIG. 1 is a circuit diagram of a related art flying capacitor type voltage detecting circuit.
Figure 2:
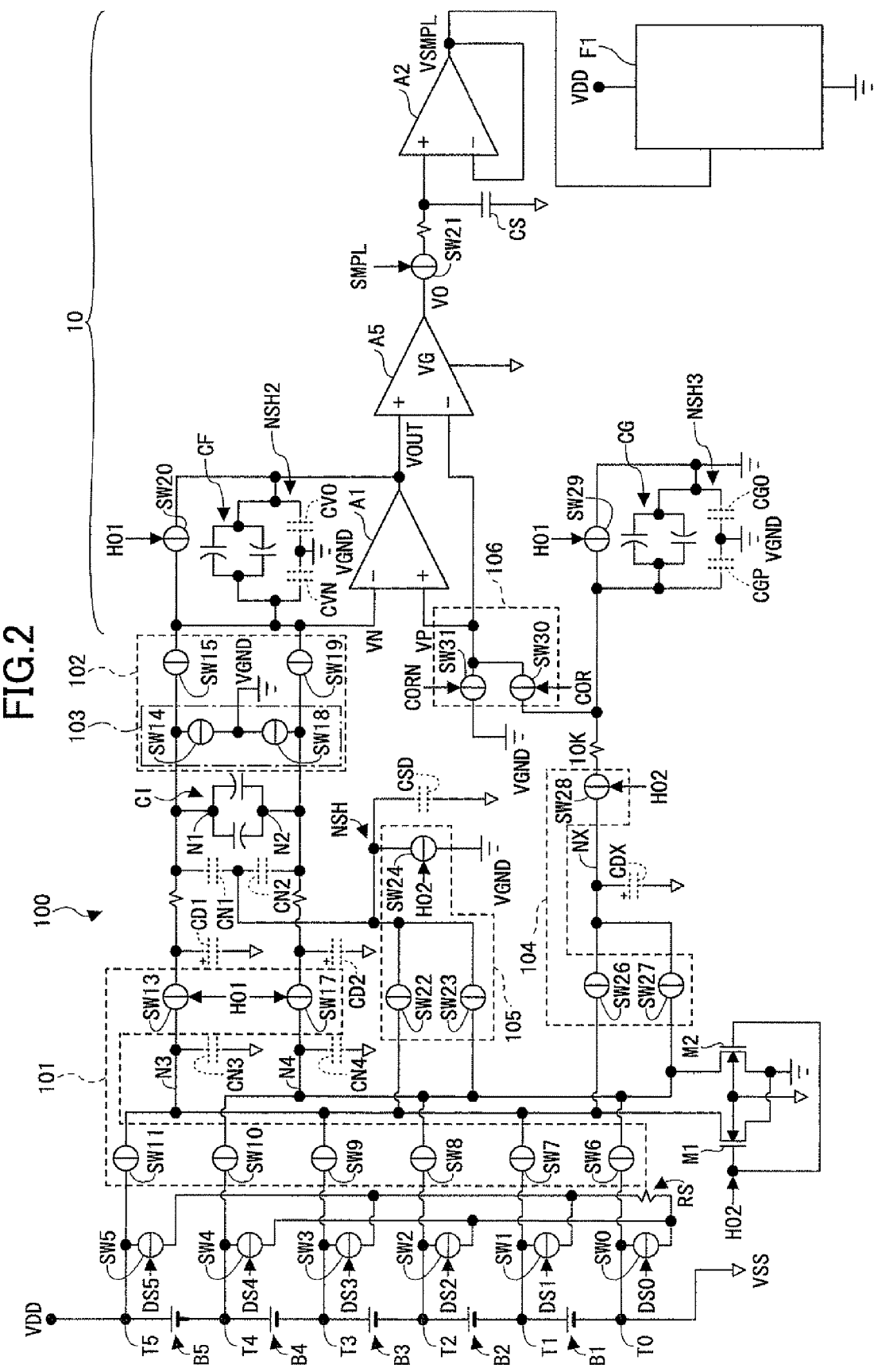
FIG. 2 is a circuit diagram of a flying capacitor type voltage detecting circuit according to an embodiment of the present invention.

Referring to the accompanying drawings, embodiments according to the present invention are explained. FIG. 2 is a circuit diagram of a flying capacitor type voltage detecting circuit 100, according to an embodiment of the present invention. Incidentally, reference symbols "SW+numeral" represent a transistor such as a metal oxide semiconductor field effect transistor (MOSFET), and capacitors illustrated by dotted lines represent parasitic capacitance. In addition, an inverted open triangle represents a reference ground VSS of a substrate on which circuit elements that constitute the flying capacitor type voltage detecting circuit 100 are formed.

The flying capacitor type voltage detecting circuit 100 includes a flying capacitor CI, an assembled battery formed of plural electric cells connected in series, a first switch circuit 101 that allows the electric cells B1 through B5 to independently charge the flying capacitor CI, a second switch circuit 102 that discharges electric charge of the charged flying capacitor CI, and an output circuit 10 that outputs a signal corresponding to electric voltage across the flying capacitor CI.

The first switch circuit 101 is configured so that polarity of electric voltage charged in the flying capacitor CI by one of the electric cells B1 through B5 is opposed to the polarity of the electric voltage charged in the flying capacitor CI by the adjacent one of the electric cells B1 through B5. To this end, the first switch circuit 101 has switches SW6 through SW11, SW13, SW17. Incidentally, the flying capacitor CI may be charged by two or more of the plural electric cells, depending on usages of the flying capacitor type voltage detecting circuit 100.

On the other hand, the second switch circuit 102 includes switches SW14, SW15, SW18, SW19, which are selectively switched thereby discharging the electric charge charged in the flying capacitor CI.

In order to detect a voltage of, for example, the electric cell B1, the flying capacitor CI is first electrically charged by turning on the switches SW6, SW7, SW13, and SW17 of the first switch circuit 101. After the flying capacitor CI is fully charged, the first switches SW6, SW7, SW13, and SW17 are turned off and switches SW14, SW19 are turned on, which allows the electric charge of the flying capacitor CI to be transferred to an integral capacitor CF. As a result, a converted voltage VOUT(1), which corresponds to the voltage of the battery B1, appears at an output terminal of an operational amplifier A1 as a detected voltage of the battery B1. After the electric charge of the flying capacitor CI is transferred to the integral capacitor CF, the switches SW14, SW19 are turned off.

Incidentally, a shielding section NSH2 is provided around electrodes of the integral capacitor CF, as shown in FIG. 2. The shielding section NSH2 is connected to a reference terminal VGND (described later).

In order to detect a voltage of the electric cell B2, first, the first switches SW7, SW8, SW13, and SW17 of the first switch circuit 101 are turned on. With this, the flying capacitor CI is charged by the electric cell B2. Note that the voltage across the flying capacitor CI charged by the electric cell B2 has an opposite polarity with respect to the voltage across the flying capacitor CI charged by the electric cell B1. Next, the switches SW7, SW8, SW13, and SW17 are turned off and switches SW18, SW15 of the second switch circuit 102 are turned on, which allows the electric charge of the flying capacitor CI to be transferred to the integral capacitor CF. As a result, a converted voltage VOUT(2), which corresponds to the voltage of the battery B2, appears at an output terminal of an operational amplifier A1 as a detected voltage of the battery B2. After the electric charge of the flying capacitor CI is transferred to the integral capacitor CF the switches SW18, SW15 are turned off.

The flying capacitor type voltage detecting circuit 100 is further provided with a shielding section NSH, which makes parasitic capacitance uniform around the flying capacitor CI, and an electric potential difference controlling circuit (described later), which makes electrical electric potential differences identical between the electrodes of the flying capacitor CI and the shielding section NSH at the timing of charging and discharging the flying capacitor CI. Referring to FIG. 2, a parasitic capacitor CN1 is illustrated in order to indicate parasitic capacitance caused between one of the electrodes of the flying capacitor CI and the shielding section NSH, and a parasitic capacitor CN2 is illustrated in order to indicate parasitic capacitance caused between the other electrode of the flying capacitor CI and the shielding section NSH. In the following, the parasitic capacitors CN1, CN2 may be referred to as parasitic capacitance CN1, CN2, if necessary. In addition, switches SW22, SW23, SW24, which constitute a short circuit, are illustrated as an example of the electric potential difference controlling circuit.

According to such configuration, the parasitic capacitances CN1, CN2 between the flying capacitor CI and the shielding section NSH become identical, and the electric potential differences between the electrodes of the flying capacitor CI and the shielding section NSH become identical at the timing of charging and discharging the flying capacitor CI. Therefore, no electric charges are transferred between the flying capacitor CI and the shielding section NSH when the flying capacitor CI discharges the charged electric charge, and thus the parasitic capacitances CN1, CN2 around the flying capacitor CI is not influenced by switching the electric cells B1 through B5. Therefore, accurate voltage detection is realized. In other words, influence of the parasitic capacitance around the flying capacitor CI on the voltage detection accuracy is reduced.

Next, a specific configuration of the flying capacitor CI and the shielding section NSH of the flying capacitor type voltage detecting circuit 100 according to this embodiment is explained with reference to FIG. 3.

The shielding section NSH has shield electrodes L3, L4 maintained at the same electric potential. The electrodes of the flying capacitor CI are arranged between the shielding electrodes L3, L4. The shielding electrode L3 is configured, for example, as a diffusion layer formed in an upper surface of an IC substrate S1. The shielding electrode L4 is configured, for example, as an electrically conductive layer formed in the form of a sheet on the IC substrate S1. More specifically, the shielding electrode L4 is a metallization layer formed of, for example, aluminum or the like. The other circuit elements of the flying capacitor type voltage detection circuit 100 shown in FIG. 2 are formed on or in the IC substrate S1.

The flying capacitor CI in the illustrated example includes a first capacitor formed of electrodes L11, L12, and a second capacitor formed of electrodes L21, L22. The first and the second capacitors are configured to have the same electric capacity. The electrodes L11, L21 oppose the shielding electrode L3, and the electrodes L12, L22 oppose the shielding electrode L4. In addition, the electrodes L11, L12 are connected by a wiring W1 so that the electrodes L11, L12 are maintained at the same electric potential, and the electrodes L21, L22 are connected by a wiring W2 so that the electrodes L21, L22 are maintained at the same electric potential. Moreover, the shielding electrodes L3, L4 are connected by an electric conductive member thereby to be maintained at the same electric potential.

Incidentally, reference symbol CN11 indicates parasitic capacitance between the electrode L11 and the shielding electrode L3, and reference symbol CN12 indicates parasitic capacitance between the electrode L12 and the shielding electrode L4. A sum of capacitances CN11, CN12 corresponds to the parasitic capacitance CN1 shown in FIG. 2. Similarly, reference symbol CN21 indicates parasitic capacitance between the electrode L21 and the shielding electrode L3, and reference symbol CN22 indicates parasitic capacitance between the electrode L22 and the shielding electrode L4. A sum of capacitances CN21, CN22 corresponds to the parasitic capacitance CN2 shown in FIG. 2.

Because the shielding section NSH is arranged around the flying capacitor CI, the parasitic capacitance CN11 is the same as the parasitic capacitance CN21 and the parasitic capacitance CN12 is the same as the parasitic capacitance CN22.

Therefore, the parasitic capacitance CN1 becomes identical to the parasitic capacitance CN2. In other words, the parasitic capacitance between the electrodes of the flying capacitor CI and the shielding section NSH can be made uniform.

In addition, in order to make the parasitic capacitance between the electrodes of the flying capacitor CI and the shielding section NSH more uniform, additional shielding electrodes may be formed at the same level as where the electrodes of the flying capacitor CI are formed. Such shielding electrodes are easily formed when they are at the same level as that of the electrodes of the flying capacitor CI. Specifically, electrically conductive layers (e.g., metallization layers made of aluminum and the like) L5 through L8 maintained to be at the same electrical electric potential as that of the shielding electrodes L3, L4 are preferably formed. The shielding electrodes L5, L7 are formed at the same level as the electrodes L11, L21, and the shielding electrodes L6, L8 are formed at the same level as the electrodes L22, L12.

Figure 3:
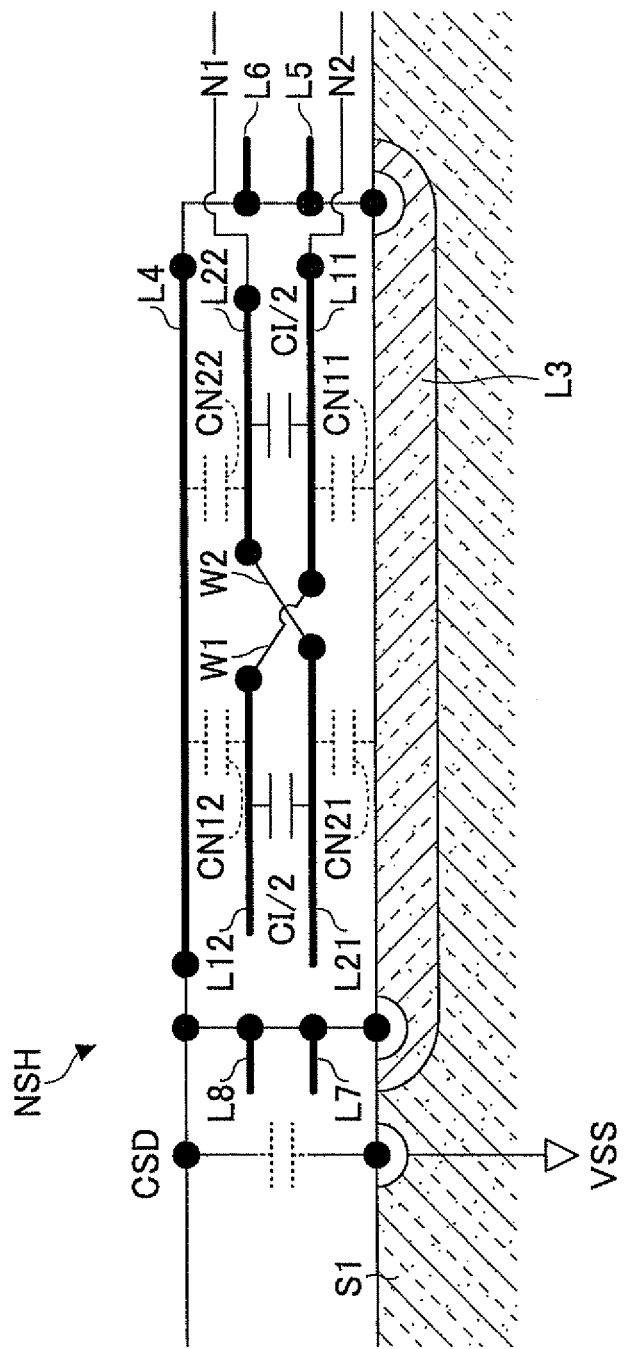
FIG. 3 is a cross-sectional view of an example of a flying capacitor and a shielding section of the flying capacitor type voltage detecting circuit according to the embodiment.

Incidentally, while the flying capacitor CI is formed of the two separate capacitors having the same electric capacity in this embodiment as shown in FIG. 3, the flying capacitor CI may be formed of three or more separate capacitors.

Next, it is specifically explained how the electric potential differences between the electrodes of the flying capacitor CI and the shielding section NSH becomes equal at the timing of charging and discharging the flying capacitor CI.

As stated above, the switches SW14, SW15, SW18, SW19 of the second switch circuit 102 shown in FIG. 2 discharge the electric charge of the flying capacitor CI. The second switch circuit 102 includes a first short circuit 103 that includes a pair of the switches SW14, SW18 to selectively short-circuit one of the electrodes of the flying capacitor CI with the reference terminal VGND. Incidentally, the reference terminal VGND is a virtual ground formed in the substrate S1 shown in FIG. 3.

In addition, the flying capacitor type voltage detecting circuit 100 of FIG. 2 is provided with the electric potential difference controlling circuit that equalizes the electric potential differences between the electrodes of the flying capacitor CI and the shielding section NSH at the timing of charging and discharging the flying capacitor CI. The electric potential difference controlling circuit includes a second short circuit 105 including the switches SW22, SW23, SW24 that are capable of selectively connecting the shielding section NSH to one of a negative terminal of the electric cell subject to voltage detection and the reference terminal VGND.

At the timing of charging the flying capacitor CI (i.e., when the flying capacitor CI is charged by one of the electric cells B1 through B5), the switch SW23 (or the switch SW22) of the second short circuit 105 is turned on, thereby to electrically connect the shield section NSH to the negative terminal of the electric cell subject to the voltage detection. At this time, because the switches SW13, SW17 are also turned on as described above, a voltage across the parasitic capacitor CN1 becomes equal to the voltage of the electric cell subject to voltage detection, and a voltage across the parasitic capacitor CN2 becomes zero (or a voltage across the parasitic capacitor CN1 becomes zero, and a voltage across the parasitic capacitor CN2 becomes equal to the voltage of the electric cell subject to voltage detection).

Next, the switch SW23 (or the switch SW22) is turned off, the switch SW24 of the second short circuit 105 is turned on at the timing of discharging the flying capacitor CI, thereby to connect the shielding section NSH to the reference terminal VGND. At this time, because the switches SW14, SW19 (or the switches SW18, SW15) are turned on, a voltage across the parasitic capacitor CN1 becomes zero and a voltage across the parasitic capacitor CN2 becomes equal to the voltage of the electric cell subject to the voltage detection (or a voltage across the parasitic capacitor CN1 becomes equal to the voltage of the electric cell subject to the voltage detection and a voltage across the parasitic capacitor CN2 becomes zero).

Therefore, the second short circuit 105 operates in such a manner that the electric potential differences between the electrodes of the flying capacitor CI and the shielding section NSH are equalized at the timing of charging and discharging the flying capacitor CI.

Incidentally, other parasitic capacitances CD1, CD2 may be generated separately from the parasitic capacitances CN1, CN2, as shown in FIG. 2. The parasitic capacitances CD1, CD2 are originated from diffusion capacitances of the switches connected to the flying capacitor CI. The switches are specifically transistors such as metal oxide semiconductor field effect transistors. Specifically, the parasitic capacitance CD1 is a total capacitance of capacitances of diffusion areas on the flying capacitor CI side of the switches SW13, SW14, SW15, and the parasitic capacitance CD2 is a total capacitance of capacitances of diffusion areas on the flying capacitor CI side of the switches SW17, SW18, SW19.

A part of the diffusion capacitances (or parasitic electric charge) is connected to the reference terminal VGND through the switch SW14 or SW18 when the electric charge of the flying capacitor CI is transferred to the integral capacitor CF, so that the part of the diffusion capacitance does not influence the detected voltage. However, another part of the diffusion capacitances (or parasitic electric charge) is connected to the integral capacitor CF through the switch SW15 or SW19 when the electric charge of the flying capacitor CI is transferred to the integral capacitor CF, and thus influences the detected voltage. Incidentally, electric charge of the parasitic capacitors CD1, CD2 depends on the voltage of the electric cell subject to the voltage detection.

In order to reduce the influence caused from the diffusion capacitances, the flying capacitor type voltage detection circuit 100 according to this embodiment is provided with an additional capacitor CG having the same electric capacity as that of the flying capacitor CI, a third switch circuit 104 including switches SW26, SW27, SW28 that allow the additional capacitor CG to be charged, and a voltage applying circuit 106 including switches SW30, SW31, which is capable of applying a voltage across the additional capacitor CG to the non-inverting input terminal of the operational amplifier A1.

The switches SW26, SW27, SW28 has the same configurations as the switches SW13, SW14, SW15 connected to the node N1 and the switches SW17, SW18, SW19 connected to the node N2. With such configurations, a parasitic capacitor CDX, which has the same electric capacity as the parasitic capacitor CD1 (or CD2) is generated. The parasitic capacitor CDX is charged at the same time when the flying capacitor CI is charged, so that the parasitic capacitor CDX charges electric charge that is the same as that of the parasitic capacitor CD1 (or CD2). In addition, the parasitic capacitor CDX is discharged at the same time when the flying capacitor CI is discharged, so that the same amount of the electric charge discharged to the integral capacitor CF is discharged to the additional capacitor CG.

Incidentally, a shielding section NSH3 is provided around electrodes of the additional capacitor CG, as shown in FIG. 2. The shielding section NSH3 is connected to the reference terminal VGND.

At the timing when the flying capacitor CI is discharged, the switch SW31 of the voltage applying circuit 106 is turned on, so that the non-inverting input terminal of the operational amplifier A1 (or a node VP) is connected to the reference terminal VGND. Therefore, electric potential variations at the non-inverting input terminal can be reduced.

After the flying capacitor CI is discharged, the switch SW31 of the voltage applying circuit 106 is turned off and the switch SW30 of the voltage applying circuit 106 is turned on, so that the voltage across the additional capacitor CG is applied to the non-inverting terminal of the operational amplifier A1.

With such operations, the detected voltage VOUT at the output terminal of the operational amplifier A1 can be accurately obtained without being influenced by the parasitic capacitances CD1, CD2.

Figure 4:
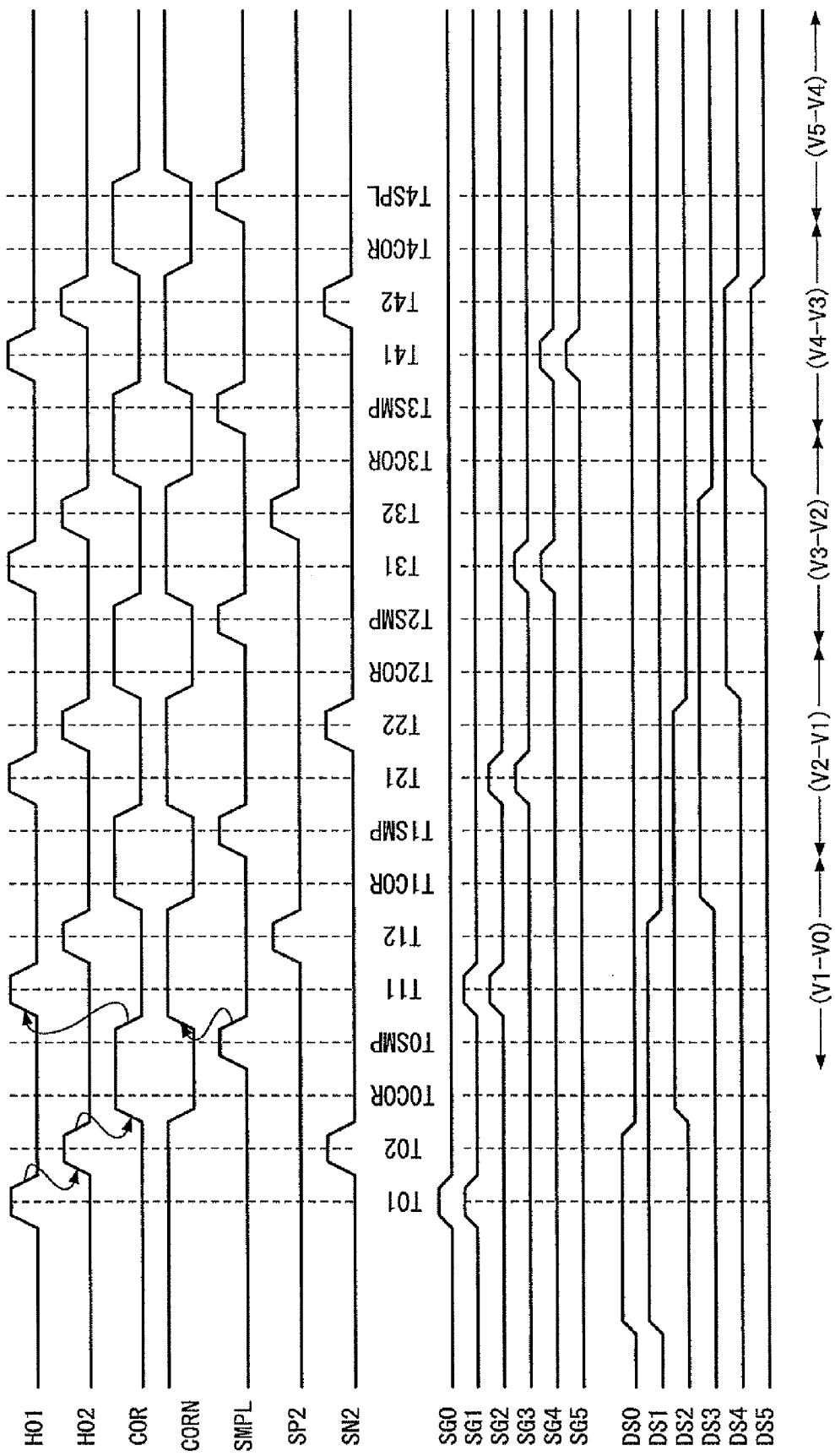
FIG. 4 is a time chart of driving signals that drive corresponding switches of the flying capacitor type voltage detecting circuit according to the embodiment.

FIG. 4 is a timing chart of driving signals that drive the corresponding switches included in the flying capacitor type voltage detecting circuit 100. Reference symbols in this timing chart correspond to those in FIG. 2. In addition, when the signals are at high levels, the corresponding switches are turned on, and when the signals are at low levels, the corresponding switches are turned off.

First, voltage detection of the electric cell B1, which is carried out at a first detection cycle of the timing chart, is explained with reference to FIG. 2.

At a timing T01 (or right before the timing T01), a driving signal H01 is output to the switch SW20, thereby to turn on the switch SW20, and to the switch SW29, thereby to turn on the switch SW29. As a result, the terminals of the integral capacitor CF are short-circuited, thereby initializing the integral capacitor CF, and the terminals of the additional capacitor CG are also short-circuited, thereby initializing the additional capacitor CG. In addition, the driving signal H01 is output to the switches SW13, SW17, thereby to turn on the switches SW13, SW17.

At the same timing (T01), driving signals SG0, SG1 are output to the switches SW6, SW7, respectively, thereby to turn on the switches SW6, SW7 of the first switch circuit 101. As a result, the flying capacitor CI is charged by electric potential difference V1 (at the node T1)−V0 (at the node T0), which corresponds to the voltage of the electric cell B1.

On the other hand, the switch SW23 of the second short circuit 105 is turned on at the timing T01, so that the shielding section NSH and the node N2 are at the same electric potential (i.e., the electric potential at the terminal T0). Therefore, a voltage across the electrodes of the parasitic capacitor CN1 becomes the same as the voltage across the electrodes of the flying capacitor CI, while a voltage across the electrodes of the parasitic capacitor CN2 becomes zero. After the flying capacitor CI is charged, the switches SW6, SW7, SW13, SW17, SW23 are turned off.

Next, at a timing T02, a driving signal SN2 is output to the switches SW14, SW19, thereby to turn on the switches SW14, SW19, so that the node N1, which is a high electric potential side, is connected to the reference terminal VGND, and the node N2, which is a low electric potential side, is connected to the inverting input terminal of the operational amplifier A1. At this moment, the electric potential at the node N2 temporarily becomes less than the electric potential at the reference terminal VGND. However, as the electric charge is transferred to the integral capacitor CF, the electric potential at the node N2 converges to the electric potential at the reference terminal VGND, namely, ground level.

On the other hand, a driving signal H02 is output to the switch SW24 of the second short circuit 105, thereby to turn on the switch SW24 at the timing T02. Therefore, the parasitic capacitance CSD between the shielding section NSH and the reference ground VSS of the substrate S1 (FIG. 3) is discharged to the reference terminal VGND, so that an influence of the parasitic capacitances CN1, CN2 on the flying capacitor CI can be suppressed.

In addition, because the electric charge CI×(V1−V0) is charged in the flying capacitor CI and the capacitance of the integral capacitor CF is the same as the capacitance CI of the flying capacitor CI, a converted voltage VOUT output at the output terminal of the operational amplifier A1 is V1−V0. In this case, because the parasitic capacitor CD2 is charged to be at the electric potential of the reference terminal VGND at the timing T02, while the electric potential difference across the electrodes of the parasitic capacitor CD2 is zero at the timing T01, the converted voltage VOUT is greater by the voltage across the parasitic capacitor CD2.

However, the switch SW27 is turned on at the timing T01 and thus the electric potential at the node NX becomes the same as that of the node N2 and the shielding section NSH, namely, the electric potential at the terminal T0, in order to compensate for electric charge injection to the integral capacitor CF from the parasitic capacitor CD2. After the switch SW27 is turned off, the switch SW28 is turned on at the timing T02, so that a voltage across the electrodes of the additional capacitor CG, one of which is connected to the reference terminal VGND, becomes V0−VGND. After the switch SW28 is turned off, the switch SW30 is turned on at a timing of T0COR, and the switch SW31 is turned off. With these operations of the switches, the voltage V0−VGND across the additional capacitor CG is applied to the non-inverting input terminal of the operational amplifier A1. With such application of the voltage, only a voltage corresponding to the electric charge charged in the flying capacitor CI appears across the electrodes of the integral capacitor CF. Here, the switch SW30 may be normally on and the switch SW31 may be normally off. Alternatively, the one end of the additional capacitor CG may be connected to a node VP of the non-inverting input terminal of the operational amplifier A1 without using the switches SW30, SW31. Even in this case, the voltage V0−VGND across the additional capacitor CG is applied to the node VP of the non-inverting input terminal of the operational amplifier A1.

In addition, an implementation amplifier A5 at the next stage of the operational amplifier A1 outputs an output voltage V0 with respect to the reference ground VSS as a detected voltage of the electric cell B1 depending on the electric potential difference between the electric potential at the output terminal VOUT and the node VP. The implementation amplifier A5 operates on the reference ground VSS of the IC substrate and has a gain of 1.

Next, when the switch SW21 is turned on in accordance with a sampling signal SMPL output at a timing T0SMP, the output voltage V0 is sampled by the sampling capacitor CS. An output voltage VSMPL of the operational amplifier A2 is maintained until the next sampling timing T1SML.

In the following, voltage detection of the electric cell B4, which is located away from the reference ground VSS, is explained with reference to FIG. 2. When the flying capacitor CI is charged by the electric cell B4, polarity of the voltage across the flying capacitor CI is opposite to that of the voltage across the flying capacitor CI that is charged by the electric cell B1.

At a timing T31 (or right before the timing T31), the driving signal H01 is output to the switch SW 20, thereby to turn on the switch SW20, and to the switch SW29, thereby to turn on the switch SW29. As a result, the terminals of the integral capacitor CF are short-circuited, thereby initializing the integral capacitor CF, and the terminals of the additional capacitor CG are also short-circuited, thereby initializing the additional capacitor CG. In addition, the driving signal H01 is output to the switches SW13, SW17, thereby to turn on the switches SW13, SW17.

At the same timing (T31), driving signals SG3, SG4 are output to the switches SW9, SW10, respectively, thereby to turn on the switches SW9, SW10 of the first switch circuit 101. As a result, the flying capacitor CI is charged by electric potential difference V4 (at the node T4)−V3 (at the node T3), which corresponds to the voltage of the electric cell B4.

On the other hand, the switch SW22 of the electric potential difference controlling circuit is turned on at the timing T31, so that the shielding section NSH and the node N1 are at the same electric potential (i.e., the electric potential at the terminal T3). Therefore, a voltage across the electrodes of the parasitic capacitor CN2 becomes the same as the voltage across the electrodes of the flying capacitor CI, while a voltage across the electrodes of the parasitic capacitor CN1 becomes zero. After the flying capacitor CI is charged, the switches SW9, SW10, SW13, SW17, SW23 are turned off.

Next, at a timing T32, a driving signal SP2 is output to the switches SW18, SW15, thereby to turn on the switches SW18, SW15, so that the node N2, which is a high electric potential side, is connected to the reference terminal VGND, and the node N1, which is a low electric potential side, is connected to the inverting input terminal of the operational amplifier A1. At this moment, the electric potential at the node N1 temporarily becomes less than the electric potential at the reference terminal VGND. However, as the electric charge is transferred to the integral capacitor CF, the electric potential at the node N1 converges to the electric potential at the reference terminal VGND, namely, ground level.

On the other hand, the driving signal H02 is output to the switch SW24 of the electric potential difference controlling circuit, thereby to turn on the switch SW24 at the timing T32. Therefore, the parasitic capacitance CSD between the shielding section NSH and the reference ground VSS of the substrate S1 (FIG. 3) is discharged to the reference terminal VGND, so that an influence of the parasitic capacitances CN1, CN2 on the flying capacitor CI can be suppressed.

In addition, because the electric charge CI×(V4−V3) is charged in the flying capacitor CI and the capacitance of the integral capacitor CF is the same as the capacitance CI of the flying capacitor CI, a converted voltage VOUT output at the output terminal of the operational amplifier A1 is V4−V3. In this case, because the electric charge of the parasitic capacitor CD1 is discharged to the reference terminal VGND at the timing T32, while the electric potential difference across the electrodes of the parasitic capacitor CD1 is V3 at the timing T31, the converted voltage VOUT is made smaller by the voltage across the parasitic capacitor CD1.

However, the switch SW26 is turned on at the timing T31 and thus the electric potential at the node NX becomes the same as that of the node N1 and the shielding section. NSH, namely, the electric potential V3 at the terminal T3, in order to compensate for electric charge injection to the integral capacitor CF from the parasitic capacitor CD1. After the switch SW26 is turned off, the switch SW28 is turned on at the timing T32, so that a voltage across the electrodes of the additional capacitor CG, one of which is connected to the reference terminal VGND, becomes V3−VGND. After the switch SW28 is turned off, the switch SW30 is turned on at a timing of T3COR, and the switch SW31 is turned off. With these operations of the switches, the voltage V3−VGND across the additional capacitor CG is applied to the non-inverting input terminal of the operational amplifier A1. With such application of the voltage, only a voltage corresponding to the electric charge charged in the flying capacitor CI appears across the electrodes of the integral capacitor CF. Here, the switch SW30 may be normally on and the switch SW31 may be normally off. Alternatively, the one end of the additional capacitor CG is connected to a node VP of the non-inverting input terminal of the operational amplifier A1 without using the switches SW30, SW31. Even in this case, the voltage V3−VGND across the additional capacitor CG is applied to the node VP of the non-inverting input terminal of the operational amplifier A1.

In addition, an implementation amplifier A5 at the next stage of the operational amplifier A1 outputs an output voltage V0 with respect to the reference ground VSS as a detected voltage of the electric cell B4 depending on the electric potential difference between the electric potential at the output terminal VOUT and the node VP. The implementation amplifier A5 operates on the reference ground VSS of the IC substrate and has a gain of 1.

Next, when the switch SW21 is turned on in accordance with a sampling signal SMPL output at a timing T3SMP, the output voltage V0 is sampled by the sampling capacitor CS. An output voltage VSMPL of the operational amplifier A2 is maintained until the next sampling timing T4SML.

According to the operations explained above, voltages proportional to voltages of the corresponding electric cells B1 through B5 are sequentially output through the operational amplifier A1 and the implementation amplifier A5. The output voltage VSMPL is supplied to a predetermined circuit F1. The circuit F1 may be, for example, an analog-to-digital converting circuit, a digital circuit, an analog circuit, or the like.

Figure 5:
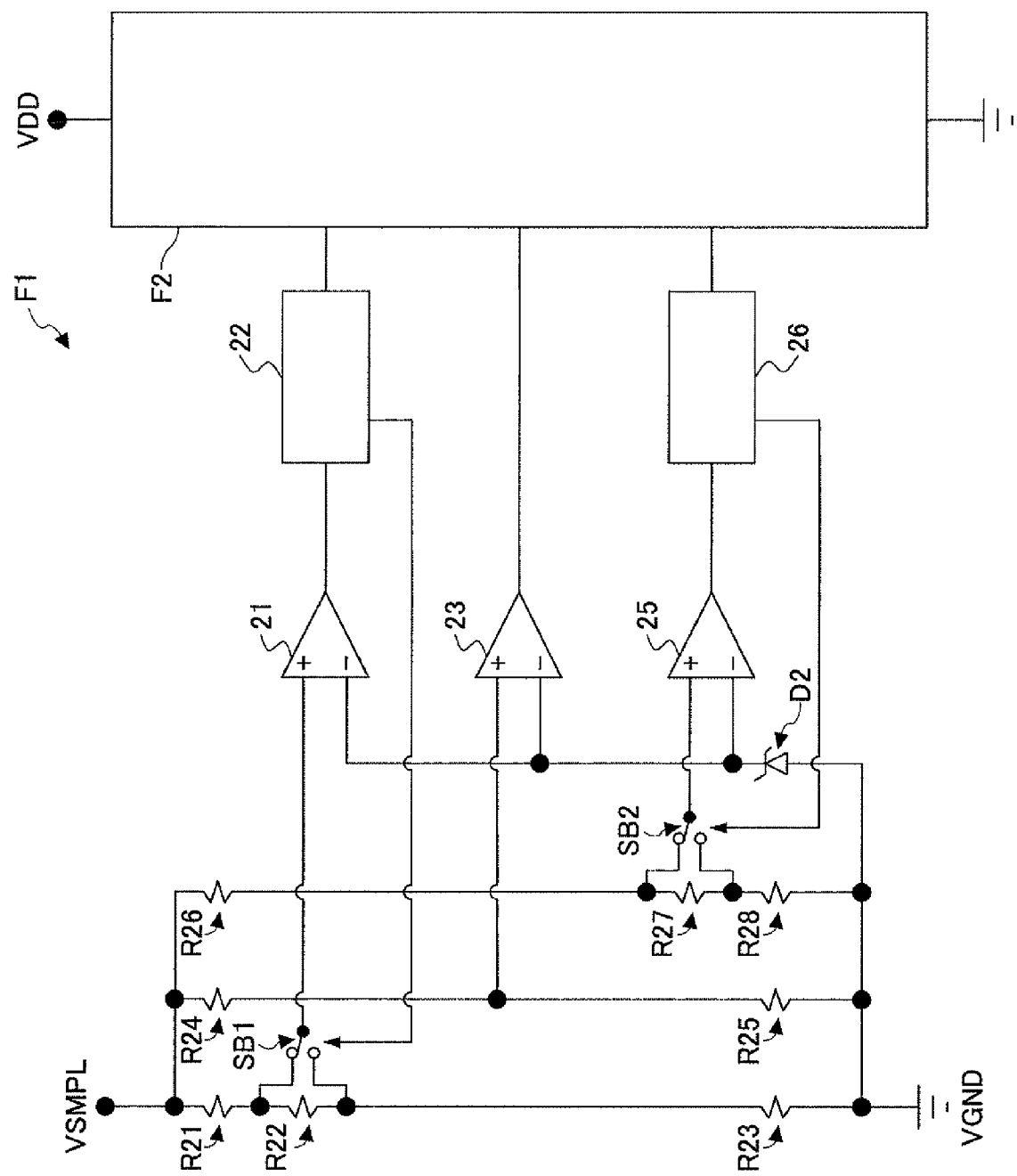
FIG. 5 is a specific example of a circuit to which an output voltage of the flying capacitor type voltage detecting circuit is supplied.

FIG. 5 illustrates an example of the circuit F1, which is configured as a determining circuit that is capable of determining a state of each of the electric cells, depending on the output voltage VSMPL. When a switch SB1 is turned on, a comparator 21 compares a detected voltage obtained by dividing the output voltage VSMPL using resistors R21, R22, R23 with a reference voltage D2, thereby detecting a voltage (referred to as a charging termination determining voltage) for determining whether electric charging should be terminated. An output signal from the comparator 21, the output signal corresponding to the charging termination determining voltage, is delayed by a delay circuit 22 and supplied to a digital circuit F2 that is capable of determining whether the electric charging should be terminated.

In addition, when a switch SB2 is turned on, a comparator 25 compares a detected voltage obtained by dividing the output voltage VSMPL using resistors R26, R27, R28 with the reference voltage D2, thereby detecting a voltage (referred to as an excessive discharging determining voltage) for determining an excessive discharging of the electric cells. An output signal from the comparator 25, the output signal corresponding to the excessive discharging determining voltage, is delayed by a delay circuit 26 and supplied to the determining circuit F2 that is also capable of determining whether the excessive discharging takes place.

In addition, along with the detection of the charging termination determining voltage and the excessive discharging determining voltage, a comparator 23 compares a detected voltage obtained by dividing the output voltage VSML using resistors R24, R25 with the reference voltage D2, thereby detecting disconnection between the electric cell and the IC. In order to detect the disconnection, the switches SW0 through SW5 (FIG. 2) are turned on in accordance with corresponding signals DS0 through DS5 (FIGS. 2 and 4) thereby to connect a resistor RS in parallel with the corresponding one of the electric cells B1 through B5, before the signal H01 is output.

When the disconnection is caused somewhere between the electric cells and the IC, it is expected that the voltage of the electric cell subject to the voltage detection cannot be accurately detected because of parasitic capacitance between the electric cell and the disconnected portion. In preparation for such circumstance, the parasitic capacitance between the electric cell and the disconnect portion is preferably discharged through the resistor RS when the disconnection is caused. When a 1 MΩ resistor is used as the resistor RS and assuming that the parasitic capacitance is 100 pF, an electrical discharging time constant is about 100 μs. When a sampling cycle is 1 ms, the parasitic capacitance can be fully discharged before the next sampling time. Incidentally, when the disconnection is caused, the voltage across the electric cell is reduced to about 1 V or less.

In addition, when a detection level for detecting the disconnection is set to, for example, 1 V, the comparator 23 can also detect a voltage reduction of the electric cell subject to the voltage detection. Namely, both disconnection and the voltage reduction can be detected by the comparator 23.

Figure 6:
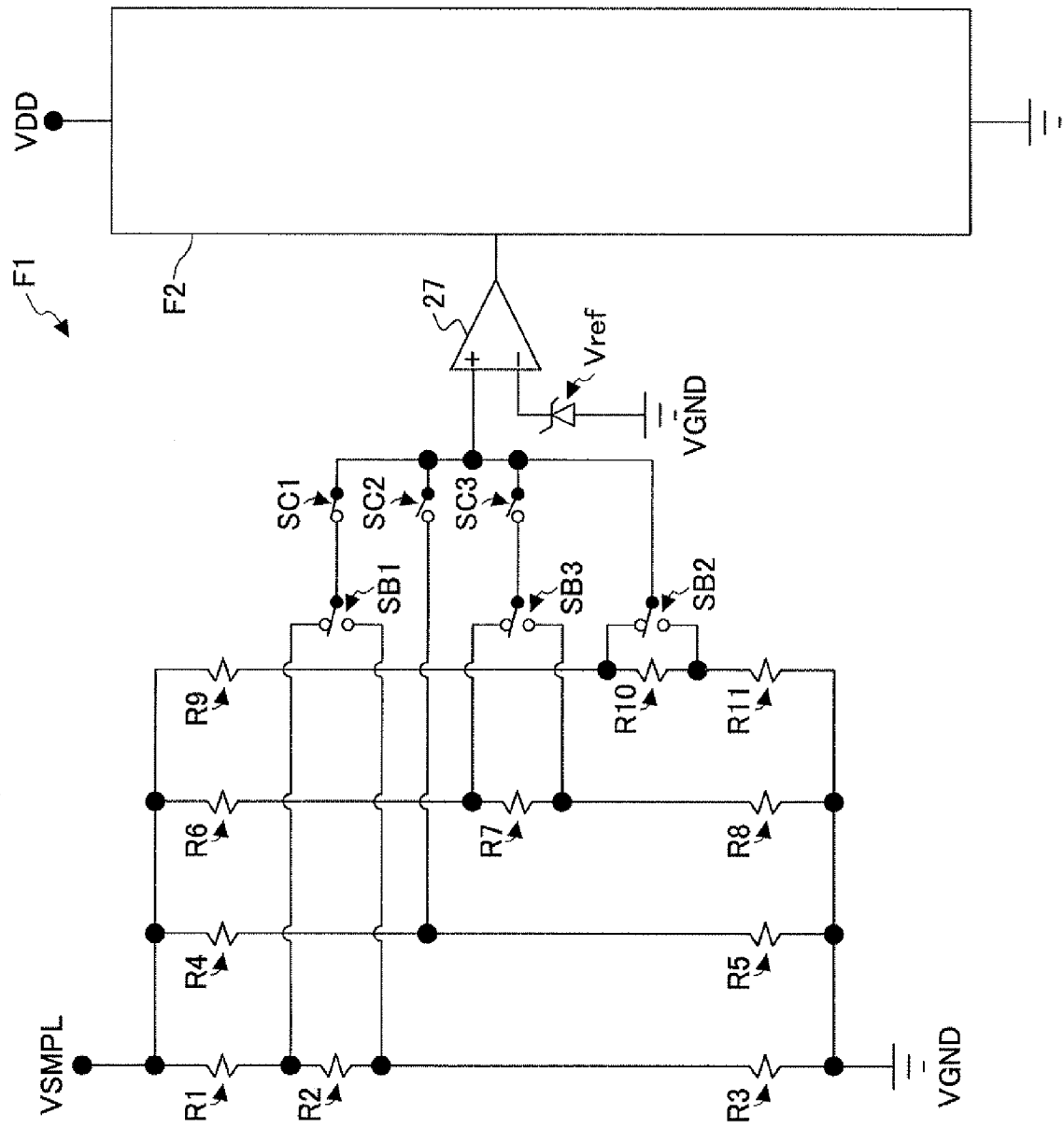
FIG. 6 is another specific example of a circuit to which an output voltage of the flying capacitor type voltage detecting circuit is supplied.

FIG. 6 illustrates a modification of the circuit shown in FIG. 5. While the three comparators 21, 22, 23 are used in the circuit of FIG. 5, the circuit of FIG. 6 is provided with one comparator 27 and three switches SC1 through SC3 at a front stage of the comparator 27. With this configuration, the comparator 27 can detect the charging termination determining voltage, the excessive discharging determining voltage, the disconnection between the electric cells and the IC, and the voltage reduction of the electric cell by selectively turning on the switches SC1 through SC3.

Figure 7:
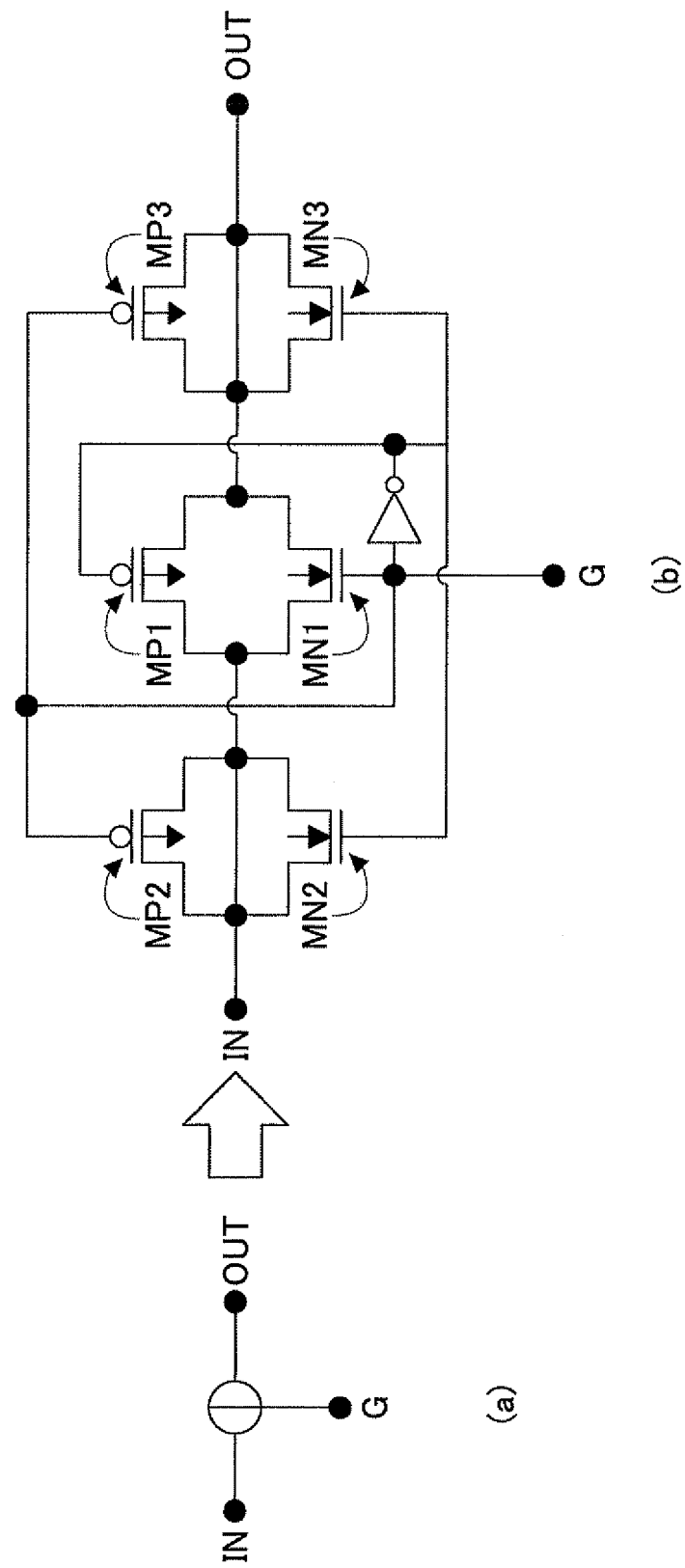
FIG. 7 illustrates an example of the switches preferably used in the flying capacitor type voltage detecting circuit according to the embodiment.

FIG. 7 illustrates an example of the switches SW0, SW1, . . . used in the flying capacitor type voltage detecting circuit 100 according to this embodiment. A section (a) of FIG. 7 illustrates a circuit symbol of the switch that is used in FIG. 2, and a section (b) of FIG. 7 illustrates a specific configuration of the switch corresponding to the circuit symbol. As shown in the section (b) of FIG. 7, a switch SW includes three N-channel transistors MN1, MN2, MN3 that are connected in series and three P-channel transistors MP1, MP2, MP3 that are connected in series. In addition, the transistors MN1 and MP1 are connected in parallel with each other; the transistors MN2 and MP2 are connected in parallel with each other; and the transistors MN3 and MP3 are connected in parallel with each other. Here, a capacitance between a gate and an input terminal of the transistor MP2 and a capacitance between a gate and an input terminal of the transistor MP3 are the same as a capacitance between a gate and an input terminal of the transistor MP1. Similarly, a capacitance between a gate and an input terminal of the transistor MN2 and a capacitance between a gate and an input terminal of the transistor MN3 are the same as a capacitance between a gate and an input terminal of the transistor MN1. In addition, an input terminal of the transistor MP1 is connected to a gate of the transistor MP2, wherein a gate size of the transistor MP2 is half of a gate size of the transistor MP1, and an output terminal of the transistor MP2 is connected to a gate of the transistor MP1, wherein a gate size of the transistor MP3 is half of a gate size of the transistor MP1. The transistors MN1, MN2, MN3 have the same configurations as the transistors MP1, MP2, MP3, respectively, and are connected in the same manner as the transistors MP1, MP2, MP3.

According to the switch SW so configured, electric charge that is pushed into a region between the gate and the drain when the gate of the transistor is on and electric charge that is drawn into a region between the gate and the source when the gate of the transistor is off are cancelled. Therefore, influence caused by the gate-switching on the detected voltage can be reduced.

Figure 8:
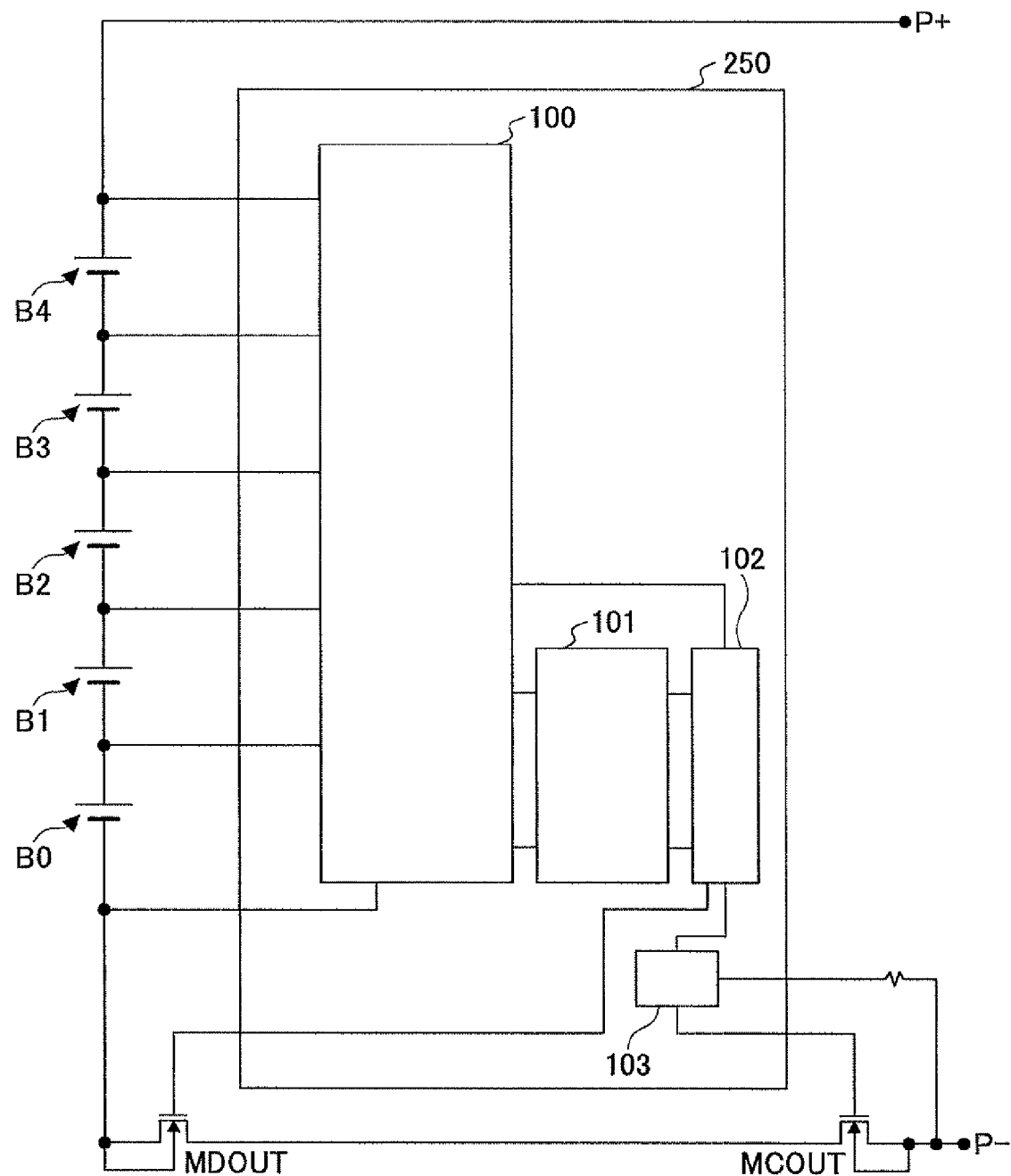
FIG. 8 is a circuit diagram of a protection circuit in which the flying capacitor type voltage detecting circuit according to the embodiment is integrated.

FIG. 8 is a circuit diagram of a protection IC that includes the flying capacitor type voltage detecting circuit according to an embodiment of the present invention. A protection IC 250 has the flying capacitor type voltage detecting circuit 100 incorporated therein. The protection IC 250 controls a transistor MDOUT and a transistor MCOUT that switch electric current that flows through the electric cells B0 through B4, depending on the voltage detected by the flying capacitor type voltage detecting circuit 100. The protection IC 250 may be implemented along with the electric cells B0 through B4 in an electronic apparatus such as a cellular phone (not shown), or in a battery pack (not shown) that is to be coupled to the electronic device. The cellular phone and the battery pack are connected to external electric power terminals P+ and P−.

While the present invention has been described in reference to the foregoing embodiments, the present invention is not limited to the disclosed embodiments, but may be modified or altered within the scope of the accompanying claims.

What is claimed is:

1. A flying capacitor type voltage detecting circuit comprising:
    a flying capacitor;
    a first switch circuit that allows each of plural electric cells that are connected in series constituting an assembled battery to individually charge the flying capacitor, so that polarity of voltage across electrodes of the flying capacitor when charged by a first one of the plural electric cells is opposite to polarity of voltage across the electrodes of the flying capacitor when charged by a second one of the plural electric cells, wherein the second one of the plural electric cells is adjacent to the first one of the plural electric cells;
    a second switch circuit that discharges the flying capacitor;
    an output circuit that outputs a signal depending on the voltage across the flying capacitor;
    a first shielding section that is arranged around the electrodes of the flying capacitor to substantially equalize parasitic capacitances between the first shielding section and each of the electrodes; and
    an electric potential difference controlling circuit that substantially equalizes voltage between one of the electrodes of the flying capacitor and the first shielding section when the flying capacitor is charged, and equalizes voltage between another one of the electrodes of the flying capacitor and the first shielding section when the flying capacitor is discharged.

2. The flying capacitor type voltage detecting circuit according to claim 1, wherein the first shielding section comprises a first shielding electrode and a second shielding electrode that are arranged to be maintained at the same electric potential, and wherein the electrodes of the flying capacitor are arranged between the first and the second shielding electrodes.

3. The flying capacitor type voltage detecting circuit according to claim 2, wherein the flying capacitor comprises
    a first capacitor configured of a first capacitor electrode opposed to the first shielding electrode and a second capacitor electrode opposed to the second shielding electrode, and
    a second capacitor configured of a third capacitor electrode and a fourth capacitor electrode, wherein the third capacitor electrode is opposed to the first shielding electrode and arranged to be maintained at the same electric potential as the second capacitor electrode, and wherein the fourth capacitor electrode is opposed to the second shielding electrode and arranged to be maintained at the same electric potential as the first capacitor electrode.

4. The flying capacitor type voltage detecting circuit according to claim 2, wherein the first shielding electrode is a diffusion layer formed in a substrate, and wherein the second shielding electrode is an electrically conductive layer formed on the substrate.

5. The flying capacitor type voltage detecting circuit according to claim 4, wherein the first shielding section includes
    a second electrically conductive layer at the same level as the first capacitor electrode and the third capacitor electrode, the second electrically conductive layer being arranged to be maintained at the same electric potential as the first shielding electrode and the second shielding electrode, and
    a third electrically conductive layer at the same level as the second capacitor electrode and the fourth capacitor electrode, the third electrically conductive layer being arranged to be maintained at the same electric potential as the first shielding electrode and the second shielding electrode.

6. The flying capacitor type voltage detecting circuit according to claim 1, wherein the second switch circuit comprises a first short circuit that selectively short-circuits one of the electrodes of the flying capacitor to a reference terminal at a reference electric potential, and
    wherein the electric potential difference controlling circuit comprises a second short circuit that selectively short-circuits the first shielding section to one of the reference terminal and a negative electrode of an electric cell subject to voltage detection among the plural electric cells.

7. The flying capacitor type voltage detecting circuit according to claim 6, wherein the output circuit comprises an operational amplifier and an integral circuit that includes an integral capacitor connecting an inverting input and an output of the operational amplifier,
    wherein electric charge discharged from the flying capacitor by the second switch circuit is supplied to the integral capacitor.

8. The flying capacitor type voltage detecting circuit according to claim 7, further comprising a second shielding section that is arranged around electrodes of the integral capacitor and arranged to be maintained at the reference electric potential.

9. The flying capacitor type voltage detecting circuit according to claim 7, wherein the output circuit includes an implementation amplifier that operates with respect to the reference electric potential, wherein a non-inverting input terminal of the implementation amplifier is connected to an output terminal of the operational amplifier, and wherein an inverting input terminal of the implementation amplifier is connected to an non-inverting input terminal of the operational amplifier.

10. The flying capacitor type voltage detecting circuit according to claim 7, further comprising
an additional capacitor having the same electric capacity as the integral capacitor;
a third switch circuit that allows the additional capacitor to be charged with the same electric charge as an electric charge charged in a parasitic capacitor of a switch circuit connected to the flying capacitor; and
a voltage applying circuit that applies voltage across the flying capacitor to the non-inverting input terminal of the operational amplifier.

11. The flying capacitor type voltage detecting circuit according to claim 10, further comprising a third shielding section that is arranged around electrodes of the additional capacitor and maintained at the reference electric potential.

12. The flying capacitor type voltage detecting circuit according to claim 1, wherein the flying capacitor is integrated in an integrated circuit.

13. A battery protection integrated circuit comprising the flying capacitor type voltage detecting circuit according to claim 1, the battery protection integrated circuit protecting the assembled battery in accordance with a detection result of the flying capacitor type voltage detecting circuit.

* * * * *